(12) United States Patent
Darden et al.

(10) Patent No.: US 6,598,206 B2
(45) Date of Patent: Jul. 22, 2003

(54) METHOD AND SYSTEM OF MODIFYING INTEGRATED CIRCUIT POWER RAILS

(75) Inventors: Laura R. Darden, Essex Junction, VT (US); Scott W. Gould, South Burlington, VT (US); Patrick M. Ryan, Essex Junction, VT (US); Steven J. Urish, Burlington, VT (US)

(73) Assignee: International Business Machines Corporation, Armonk, NY (US)

(*) Notice: Subject to any disclaimer, the term of this patent is extended or adjusted under 35 U.S.C. 154(b) by 246 days.

(21) Appl. No.: 09/853,115

(22) Filed: May 10, 2001

(65) Prior Publication Data

US 2002/0170020 A1 Nov. 14, 2002

(51) Int. Cl.$^7$ .............................................. G06F 17/50
(52) U.S. Cl. ...................... 716/2; 716/4; 716/5; 716/14
(58) Field of Search .............................. 716/2, 4, 5, 11, 716/14

(56) References Cited

U.S. PATENT DOCUMENTS 6,397,170 B1 * 5/2002 Dean et al. .................... 716/4

* cited by examiner

Primary Examiner—Matthew Smith
Assistant Examiner—Thuan Do
(74) Attorney, Agent, or Firm—McGinn & Gibb, PLLC; Richard M. Kotulak, Esq.

(57) ABSTRACT

A method and system for modifying power rails of an integrated circuit having improved wireability. This is accomplished by initially generating a power railing design of the integrated circuit into a three-dimensional rail based model. Next, analysis of the design is performed as to placement of the power rails in relation to neighboring elements that affects a predefined wireability. Finally, modification of a segment of each power rail that affects wireability is performed so that required power supply to the neighboring elements (e.g., pins, rails etc.) remains unaffected.

27 Claims, 13 Drawing Sheets

METHOD AND SYSTEM OF MODIFYING INTEGRATED CIRCUIT POWER RAILS

BACKGROUND OF THE INVENTION

1. Field of the Invention

This invention relates to the physical design of semiconductor integrated circuits, and more particularly to a physical design methodology and tools which automatically modify power shapes to improve overall wireability in congested areas and provide access to inaccessible pins or logic service terminals (LSTs).

2. Description of the Related Art

During physical design of integrated circuits, automatic placement tools are typically used to obtain placement for functional library cells in the design. Automatic power routing tools are typically used to route the power rails of the design. Congestion analysis tools are used to analyze the resulting design after placement and power routing has been completed and prior to final signal wiring. Congestion analysis gives an early indication of the likely success of signal wiring. International Business Machines Corporation of Armonk, N.Y., USA provides placement, power routing, congestion analysis and detail wiring in their commercially available ChipBench tool suite. A cell-3 brand automatic layout tool (available from Cadence Design of Santa Clara, Calif., USA) provides similar functionality. In highly congested areas of the design, it is desirable to reduce the congestion to improve the success of automatic wiring. Typical power shapes tend to be periodic rails on each metal level spanning large areas of the design. Power rails on adjacent metal levels are connected by power vias at their intersections forming a three dimensional power grid. Congestion could be reduced by using significantly smaller power shapes during power routing. However, this dramatically increases the number of power shapes, which impacts the storage and performance of the layout related tools. Thus, it is an object of the invention to utilize unmodified power rail shapes whenever possible to maintain current tool performance and memory usage and at the same time reduce congestion by modifying power shapes in highly congested areas.

Additionally, input/output LSTs (pins or logic service terminals) of placed library cells sometimes become blocked by the power rails during power routing, making connection impossible. It is desirable to ensure all pins are accessible prior to automatic signal wiring.

Reducing congestion and improving pin accessibility increases the ability to complete automatic wiring successfully. Thus, there has arisen a need for an efficient method of modifying power shapes to reduce congestion and improve wireability in an application specific integrated circuit (ASIC) design.

SUMMARY OF THE INVENTION

It is therefore one object of this invention to provide an automatic physical design tool to reduce wiring congestion and improve wireability in an ASIC design that is independent of the underlying design methodology.

It is yet another object of the invention to provide an automatic physical design tool that improves pin accessibility and therefore increases wireability in an ASIC design that is independent of the underlying design methodology.

It is yet another object of this invention to provide a physical design methodology that has no major impact on the memory requirements or performance of other tools in the layout tool suite used for a given ASIC design.

In accordance with these and other objectives, the present invention provides a design tool and methodology which detect congested wiring areas of a design or inaccessible pins of a design, and replaces the power rail structure(s) in these areas with a modified power structure(s) that reduces wiring congestion and allows pin access. In a first embodiment of the invention, a three-dimensional model of the ASIC design is used. The inputs to the invention are the various shapes currently in the ASIC design and their interconnections which includes, but is not limited to, power shapes, circuit placement, pins, and abstracted blockages. For all inaccessible pins blocked on the metal level above by a power rail, the invention removes select areas of the power rail on the metal level directly above each pin while maintaining interconnection with other power shapes. The first embodiment operates in an iterative manner from metal level to metal level until complete.

Another embodiment of the invention includes an alternative power pattern for the power rails to relieve wiring congestion in affected areas of an ASIC design. This embodiment of the invention determines areas of the design that benefit by changing the power rail pattern from an initial pattern to an alternative pattern such as stitches or staples. The second embodiment can operate in an iterative manner to achieve a desired wireability result.

ASIC images which include power patterns and image metals are combined to create an ASIC power grid from chip wire bond pads or chip C4 balls (depending on the ASIC package requested) to the ASIC cells. These images are pre-designed and not modified during a typical ASIC physical design process so as not to impact the ASIC chip turn-around-time. The image and power patterns are analyzed for IR drop and electromigration (EM) using worst case power requirements for each image/package offering during the early development of each new ASIC technology. "RailMill" tool, available from Synopsys Inc., Mountain View, Calif., USA is a commercial reliability simulator that analyzes power network voltage drop of an IC network. The image power grid described in this invention was designed and analyzed for IR drop and EM using the M2 power staple pattern described below. The M2 power staple pattern, when compared with the other M2 power patterns of stitches or rails, is the least electrically robust though not significantly due to other pinch points in the power grid on other levels. Therefore the process described in this invention of converting M2 power rails to either stitches or staples is electrically accounted for in the initial image analysis and not required to be re-analyzed after each change to the M2 power grid.

Thus, the invention provides a method and system for modifying power rails of an integrated circuit to improve wireability. This is accomplished by initially generating a model of a three-dimensional rail based power grid. Next, analysis of the design is performed as to the location of the power rails in relation to neighboring elements (e.g., pins, rails, blockages, etc.) with respect to congestion and pin accessibility that affects a predefined wireability. Finally, modification of a segment of each power rail that affects wireability is performed so that required power supply potential to the neighboring elements remains unaffected.

BRIEF DESCRIPTION OF THE DRAWINGS

The foregoing and other objects, aspects and advantages will be better understood from the following detailed description of a preferred embodiment(s) of the invention with reference to the drawings, in which.

DETAILED DESCRIPTION OF PREFERRED EMBODIMENTS OF THE INVENTION

The invention discussed below includes two preferred embodiments for modifying power shapes using a physical design tool. These embodiments are configured for use as software forming existing physical design tool suites. The invention is developed as a functional aspect of IBM's graphical physical design tool suite, ChipBench as discussed above, and IBM's graphical physical design editor, ChipEdit. Other physical design tool suites can include the invention.

Figure 4:
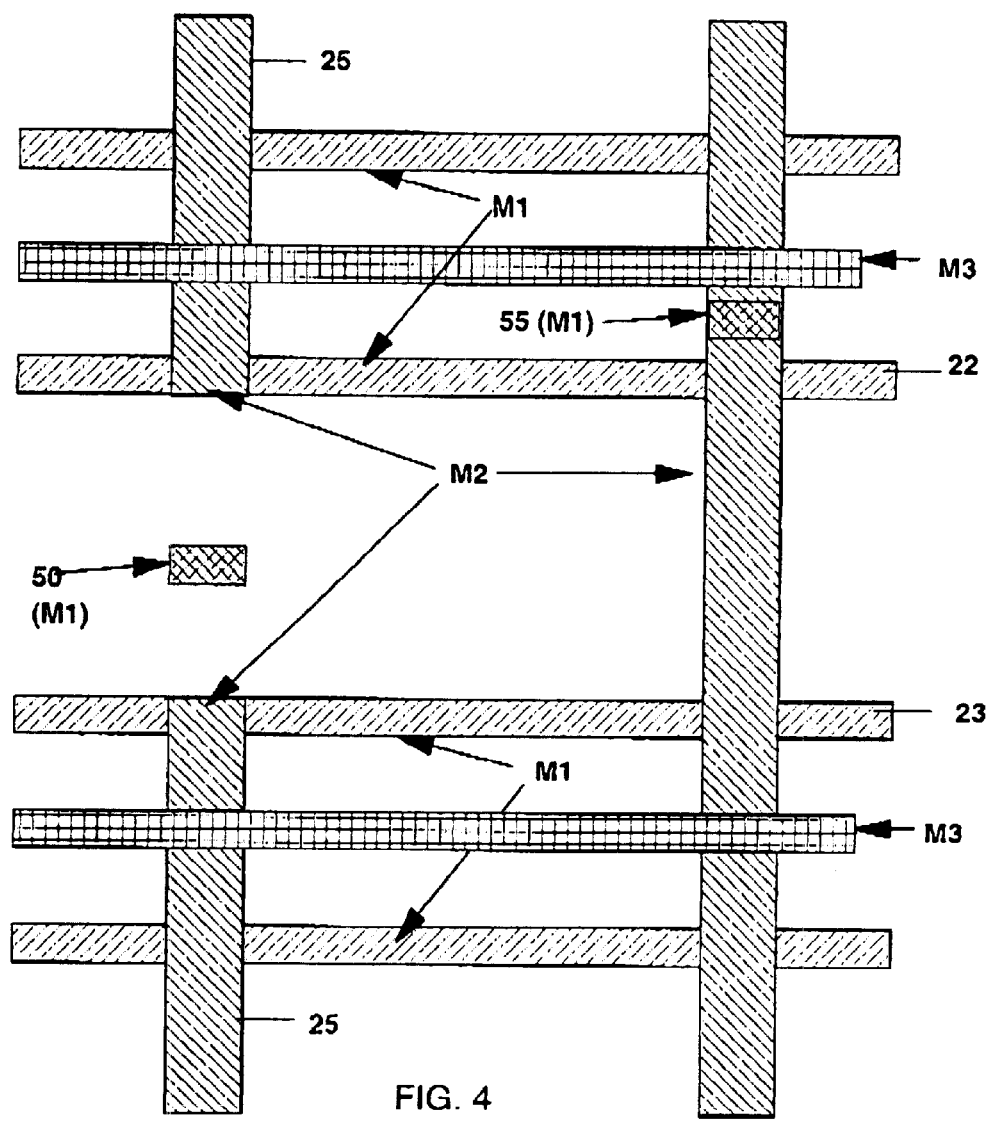
FIG. 4 shows modified FIG. 3 wherein an M2 power rail is cut to expose the M1 pin.
Figure 5:
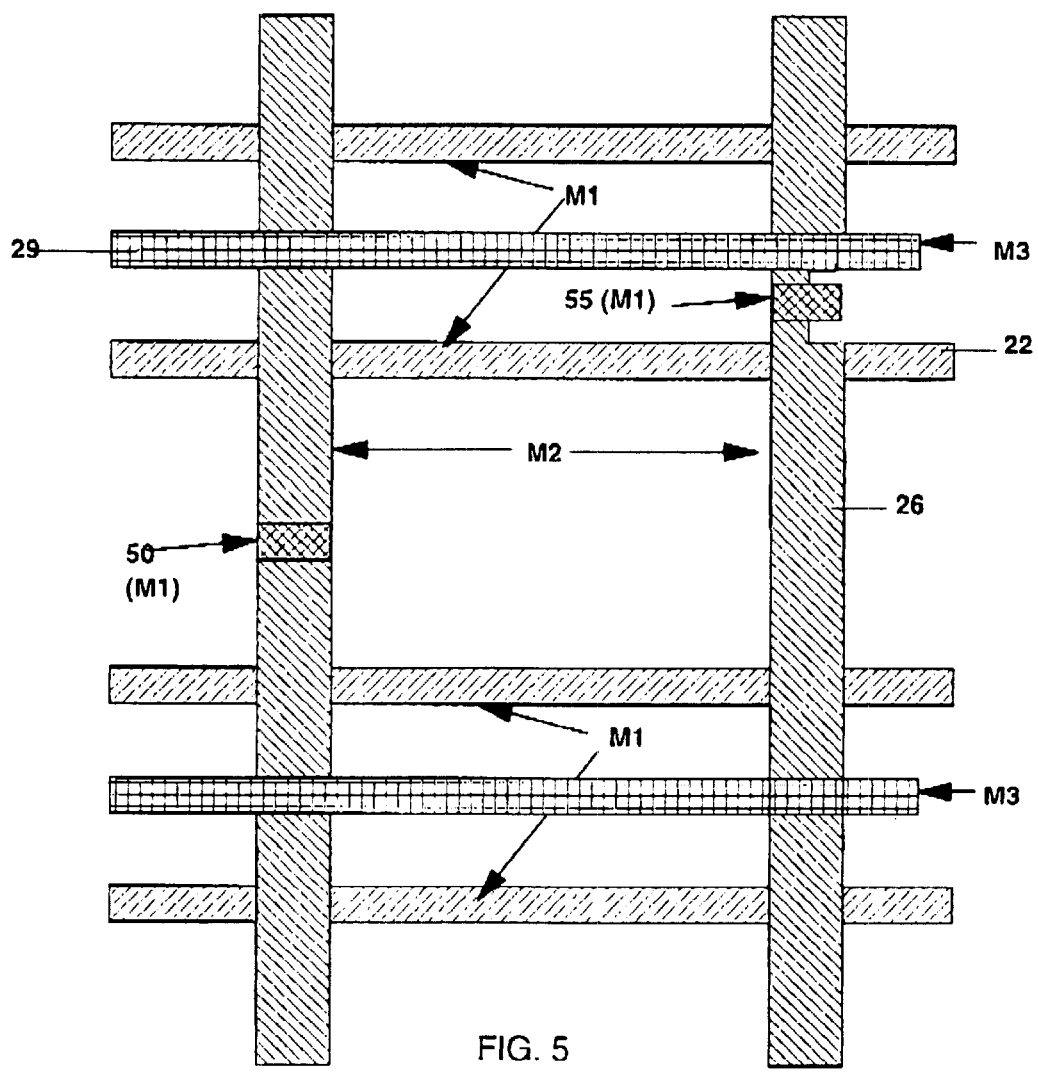
FIG. 5 shows modified FIG. 3 wherein an M2 power rail is "notched" to expose the M1 pin.
Figure 11:
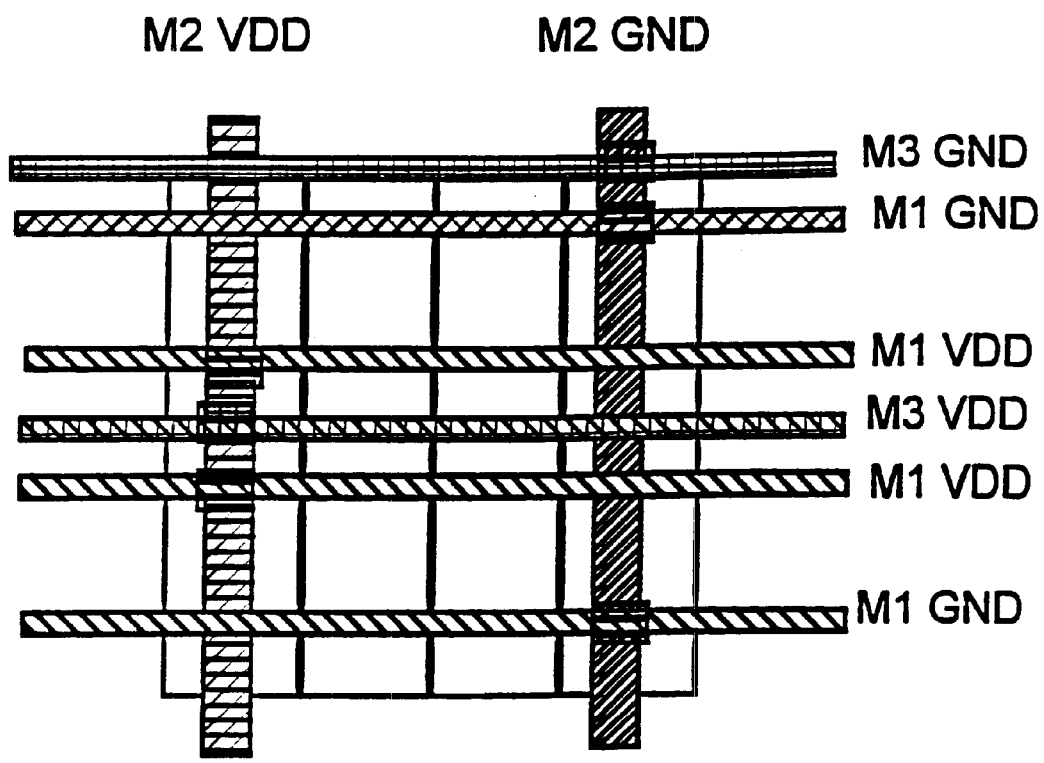
FIG. 11 shows an example power rail placement such as in FIG. 2 for two polarities of power, VDD and GND, where horizontal M1 and M3 power rails connect by power vias to vertical M2 power rails.

Certain general definitions concerning the invention assist in understanding the utility of the invention. To so assist in this endeavor, a "ASIC" design is any entity including, but not limited to terms that refer to, a chip, a hierarchical entity of a chip (random logic macro (RLM), voltage island), or an embedded core (static random access memory (SRAM), register array (RA), etc.). "Wireability" is defined as a metric to determine whether a given cell placement can be completely connected both automatically and/or manually given a specified number of wiring planes and fixed blockage. "Congestion" is defined as the ratio of the occupied area of a design to the total area of the design. Typically, a "power rail" is defined as a long, narrow power rectangle placed horizontally or vertically on a conductive metal wiring level. Typically, a three-dimensional "power grid" is defined by stacking metal levels of alternating horizontal and vertical power rails periodically placed as to permit signal routing in between adjacent rails on the same level. The power rails on adjacent conductive levels are interconnected through vias in insulating layers separating the conductive levels. Conductive metal levels for logical interconnect in the ASIC typically use notation M1, M2, M3, etc. to indicate the level in an integrated circuit at which the conductive level resides. Thus, M1 refers to the metal 1 level, M2 refers to the metal 2 level, and M3 refers to the metal 3 level. Note also that each of the M2 vertical power rails is coupled to corresponding horizontal rails for supplying a requisite voltage potential in the M1 and M3 levels as illustrated and labeled by the FIGS. 2–8 herein. For exemplary purposes, FIGS. 2–8 have been simplified to illustrate only one polarity of power, such as either VDD or GND, and power vias are implied at intersections of horizontal and vertical power shapes. FIG. 11 illustrates a section of a power grid for two polarities of power and the power vias are explicitly drawn in this diagram. A "wiring track" is defined as the minimum periodicity for a minimum width wire and a minimum width space in a given design technology. A "power stitch" is defined as a short power rectangle which must connect by a minimum number of power vias as defined by the technology at each end of the rectangle to only those power rails on adjacent metal levels nearest to itself as shown as 65 in FIG. 7. A "power staple" is defined as a "C" shaped power polygon, represented as three intersecting minimum width rectangles, which must connect by a minimum number of power vias as defined by the technology at each short end of the "C" to only those power rails on adjacent metal levels nearest to itself as shown as 70 in FIG. 8. In the preferred embodiments, the minimum number of power vias at each overlying power intersection is two. As such, the width of the M2 power rails in exemplary form is two vertical wiring tracks. A notched power rail is a power rail where a rail segment has been trimmed back to a minimum metal width, as shown in FIG. 5.

Although a typical design for supplying power is in great use in integrated circuit design today, power rails frequently contribute to wiring congestion. Furthermore, input/output pins or logic service terminals (LSTs) of a circuit implementation of a cell may be inaccessible due to an overlying power rail. This problem is resolved by the invention.

The preferred software for supporting the invention which is run on standard hardware design environments was developed as a function of IBM's physical design suite ChipBench and editor ChipEdit. However, other physical design systems are publicly available, such as CELL-3 tools from Cadence Design Systems, Inc., which can be adapted to reduce wiring congestion by the invention described herein.

FIRST EMBODIMENT

Figure 1:
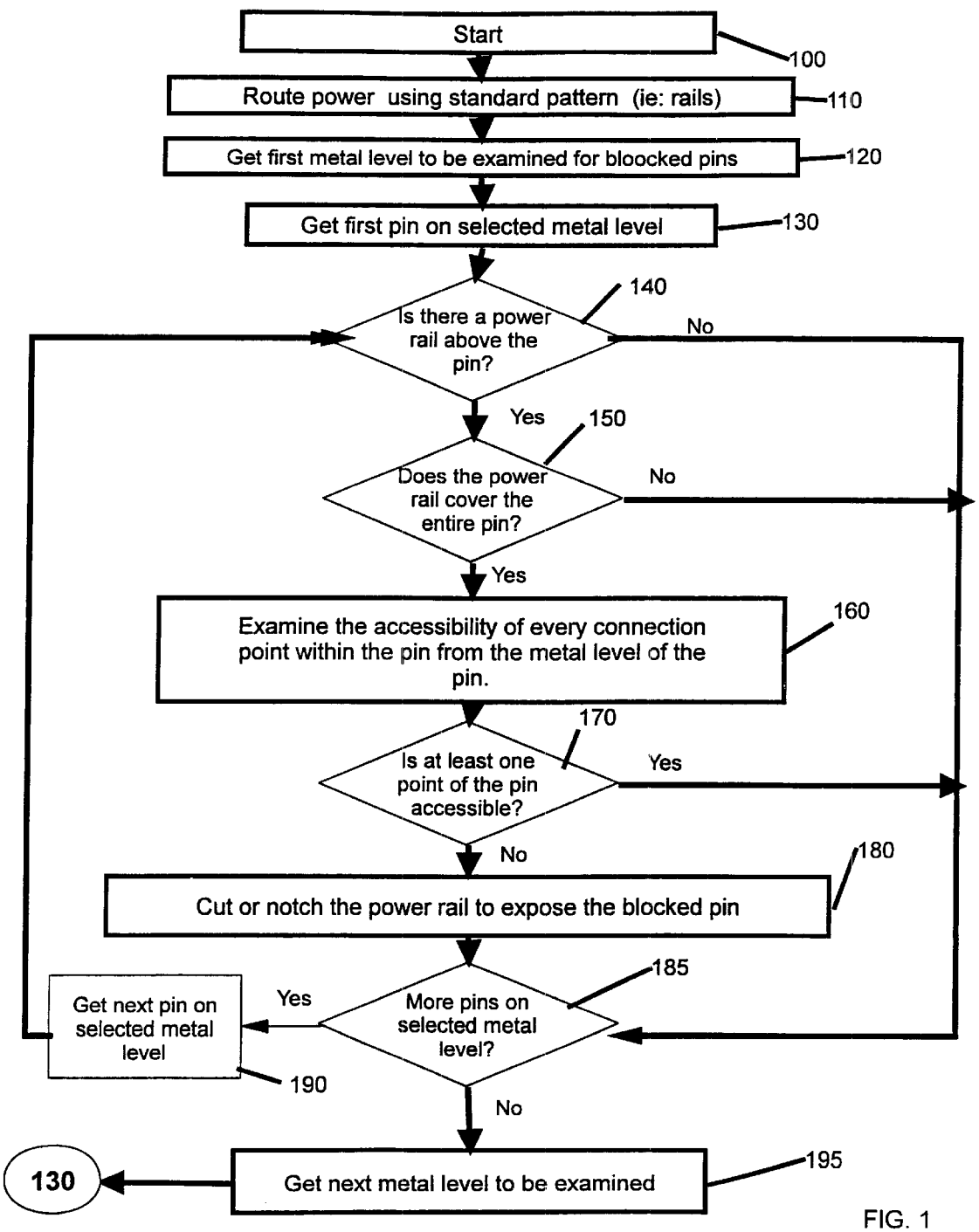
FIG. 1 is a flow diagram illustrating the first embodiment of the invention.

The first embodiment of the invention is shown in FIG. 1 as follows and is illustrated with an exemplary power rail design for one polarity of power as shown in FIGS. 2–6. This embodiment of the invention improves M1 pin accessibility (and therefore design wireability), in a power rail design by cutting or notching the inhibiting M2 power rails while maintaining their connection to standard M1 and M3 power rails and maintaining the integrity of the power grid.

Figure 2:
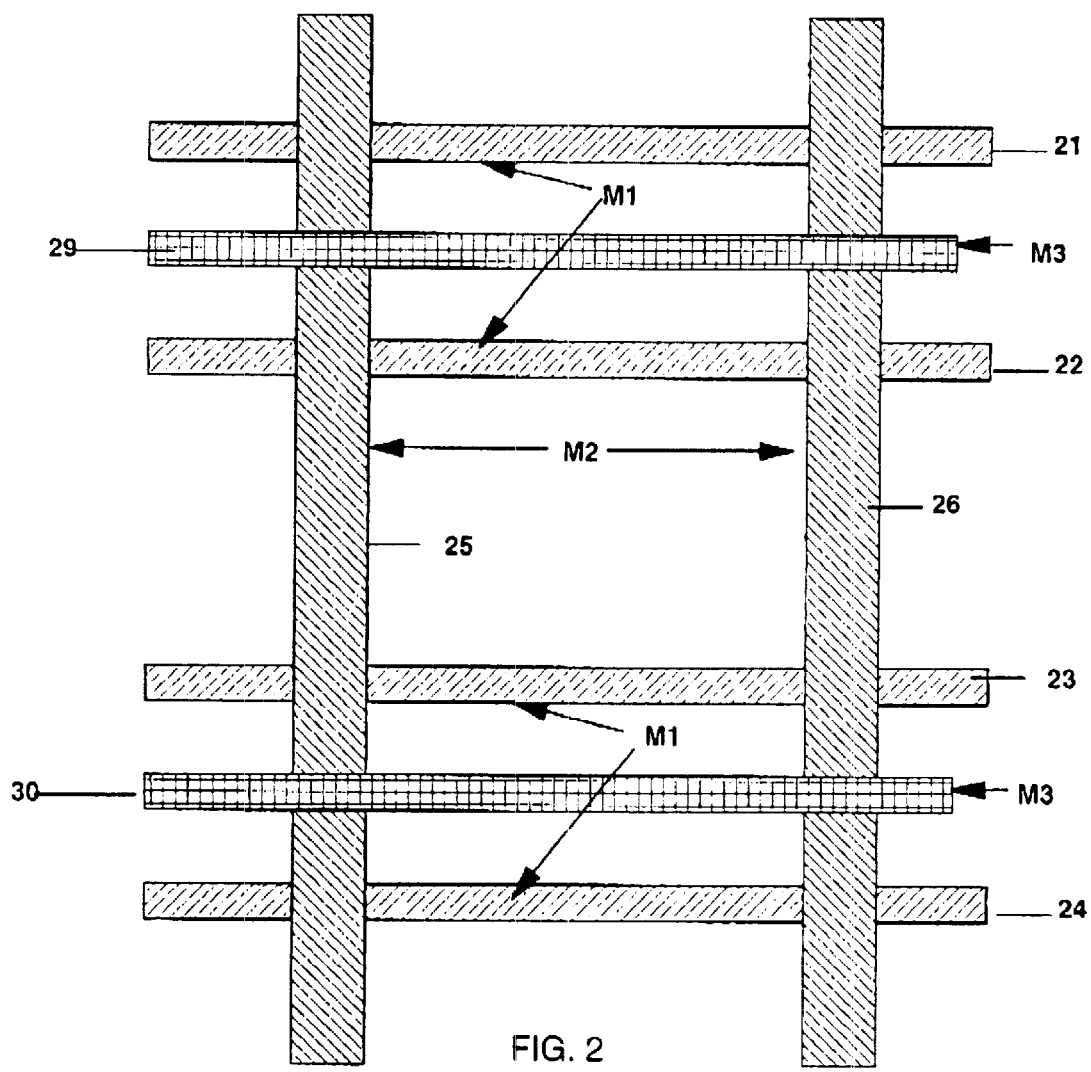
FIG. 2 shows an exemplary power rail placement of one polarity of power, as VDD or GND, with horizontal M1 & M3 power rails connected by power vias to vertical M2 power rails.
Figure 3:
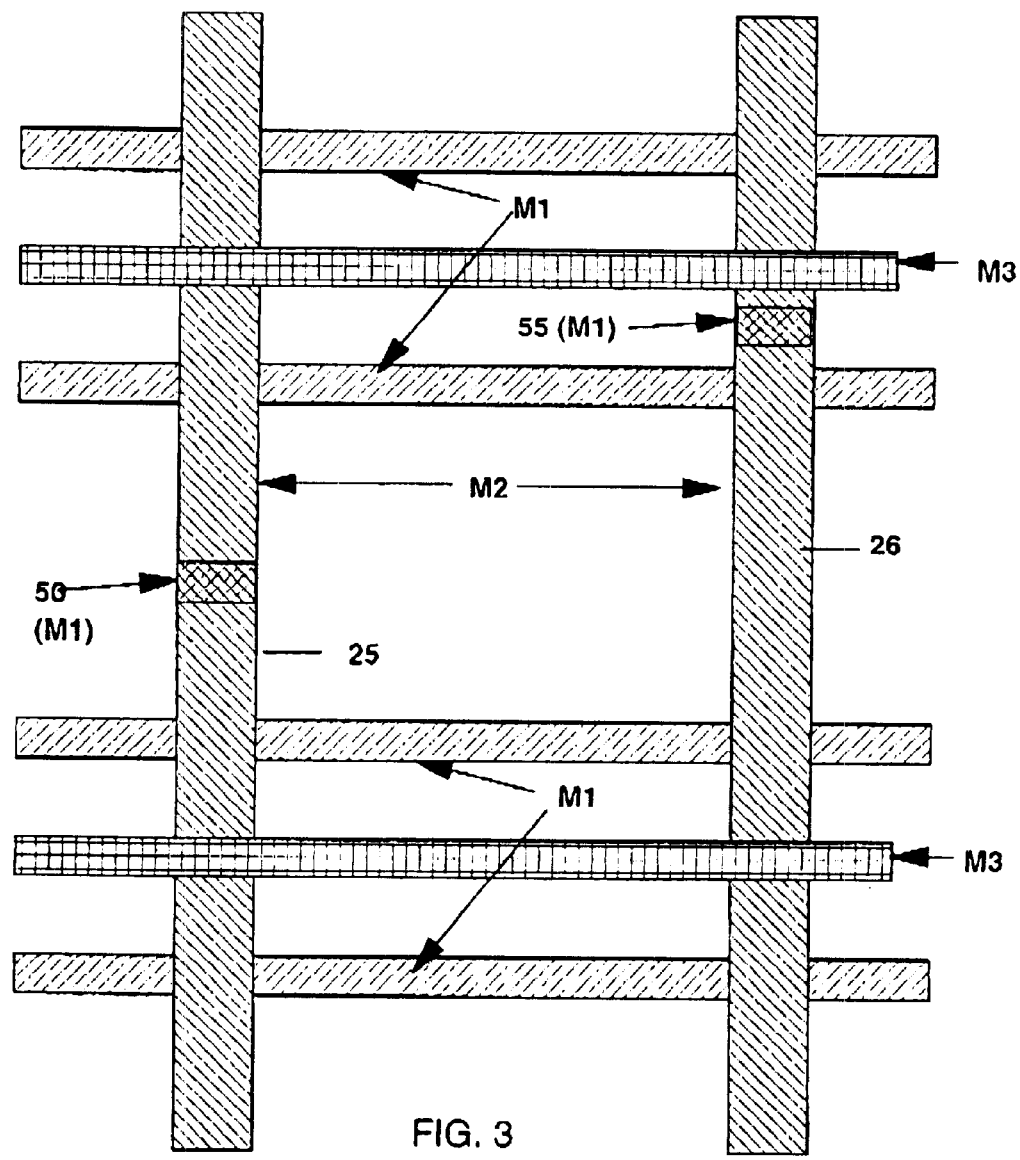
FIG. 3 shows modified FIG. 2 wherein the M2 power rails block access to M1 pins.

In FIG. 2, an example power rail placement for one polarity of power is shown wherein the M2 power rails 25 and 26 connect by power vias to M1 power rails 21, 22, 23 and 24 and M3 power rails 29 and 30. FIG. 3 shows the power rails of FIG. 2 wherein the M2 power rail 25 blocks access to the M1 pin 50 and the M2 power rail 26 blocks access to the M1 pin 55. FIG. 4 shows M2 power rail 25 cut to expose the M1 pin 50. FIG. 5 shows M2 power rail 26 notched or trimmed back to expose the M1 pin 55.

The embodiment of the invention starts (step 100) by use of an initial power rail design. This involves routing of power rails M1, M2, M3, etc. having an initial patterning generated by the power routing tool (step 110) that are constituted by as many levels as required for the ASIC.

The power grid pattern is predefined by the technology as to the power rail width and periodicity of the power rails on each metal level. FIG. 2 shows an example power rail pattern for one polarity of power wherein the M2 vertical power rails have a width of two wiring tracks and the M1 and M3 power rails have a width of one wiring track. For every two M1 power rails, there is one M3 power rail which provides power through the M2 power rails to its neighboring M1 power rails in the power grid. This example technology requires a minimum of two power vias at each interconnection of the power rails. The invention is independent of the specific power grid pattern or the power via requirements of the technology, as these technology attributes are parameters to the invention.

Next, the method obtains the first metal level to be examined for blocked pins (step 120). This could be levels M1, M2, M3, etc. Typically, technology parameters specify which metal levels should be examined for blocked pins.

For each given metal level, the algorithm loops through all of the placed pins on that level, beginning with the first pin on the level (step 130). FIG. 3 shows two pins, 50 and 55, on the M1 level. These pins are input and output LSTs of placed circuits in the design.

Next, a decision is made at step 140 as to whether a power rail is located directly above the pin. For example, if the pin exists on M1, the algorithm would examine the location of the M2 power rails in the design. If there is no power rail above the pin, the method goes to step 185 to check for more pins. To illustrate, FIG. 3 shows the M2 power rail 25 blocks access to M1 pin 50 and M2 power rail 26 blocks access to M1 pin 55. If there exists a power rail above the pin, the method determines (step 150) whether the power rail covers the entire pin. If so, the process continues to step 160. If not, the method goes to step 185 to check for more pins.

The process then (step 160) examines the accessibility of every connection point within the pin from the metal level of the pin. In FIG. 3, the process examines all edges of the M1 pin level for accessibility from the M1 metal. Next, at (step 170), if at least one point of the pin is accessible, the process goes to step 185 wherein the process checks for more pins. If all points of the pin are inaccessible, the process goes on to step 180.

Figure 6:
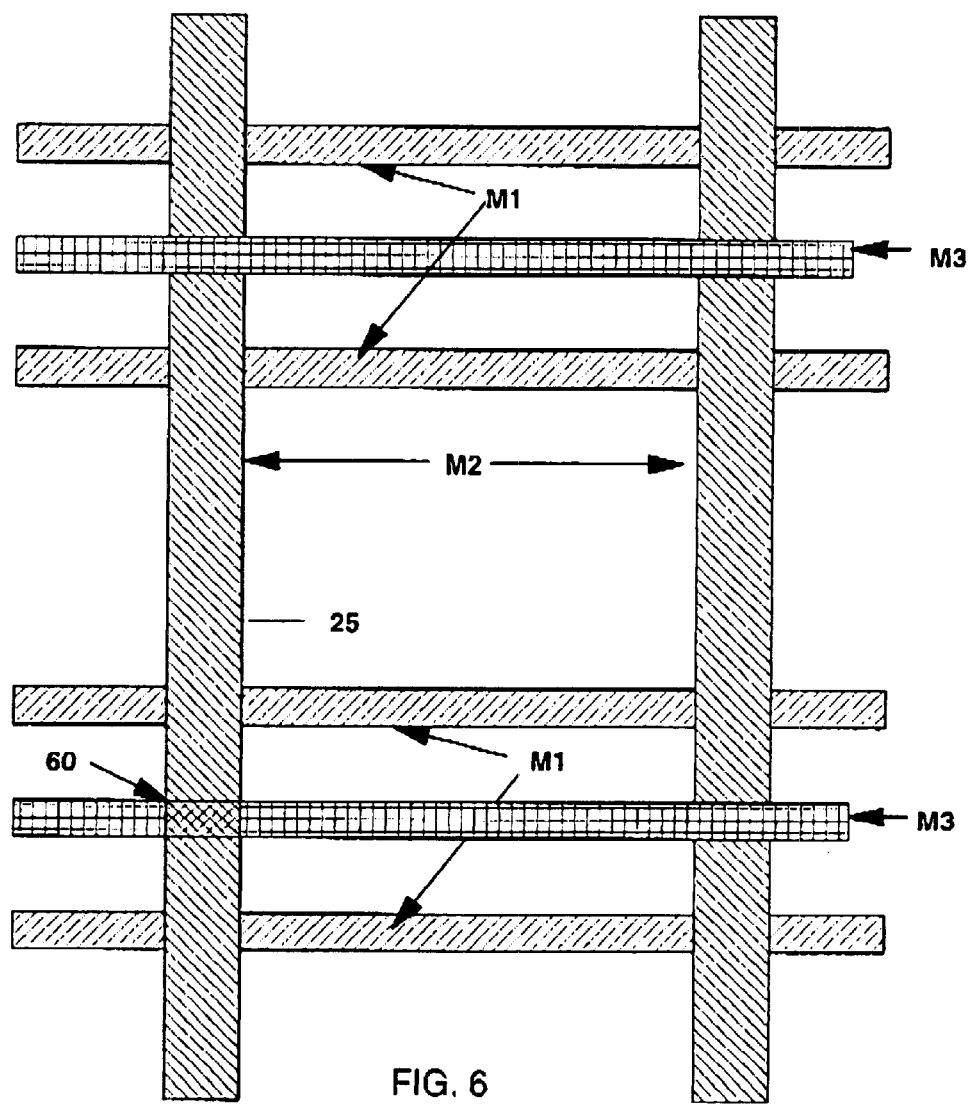
FIG. 6 shows a diagram of a blocked M1 pin which could be avoided by alignment of the M1 & M3 power rails.

Next, (step 180), the pin is determined to be blocked by the power rail. The power rail is then examined with respect to the power grid and is cut or notched so as to expose the pin while maintaining the integrity of the power grid. This step is illustrated in FIGS. 4–6 respectively. In FIG. 4, the section of the initial M2 power rail 25 blocking the M1 pin 50 is cut between its two nearest power vias, in this case, between the power vias connecting the M2 power rail 25 to the M1 power rails 22 and 23. Removing this section of the M2 power rail 25 does not compromise the integrity of the power grid. In FIG. 5, the section of the initial M2 power rail 26 blocking the M1 pin 55 is notched or trimmed directly above the pin (rather than cut) to maintain the power connection from the M3 power rail 29 to the M1 power rail 22. The notch is created such that the minimum power via requirement of the technology is still met. The placement of the M1 pin 60 in FIG. 6 blocked by the M2 power rail 25 would not allow the power rail M2 to be notched without failing to meet the minimum requirement of two power vias of our example technology. In this case the invention modifies the initial power rail pattern of the technology such that the horizontal M3 power rail is aligned with one of the horizontal M1 power rails, thus avoiding the pin placement example of FIG. 6.

Once the rail modification is complete, the process proceeds to step 185 to determine if more pins exist on the given metal level. At step 185, if more pins are yet to be examined on the selected metal level, the method continues to step 190, obtains the next pin and proceeds to step 140 to begin the examination of the next surrounding environment of that pin. If there are no more pins on the selected metal level, the process obtains the next metal level to be examined at (step 195) and the process goes back to (step 130) and cycles again.

SECOND EMBODIMENT

Figure 9:
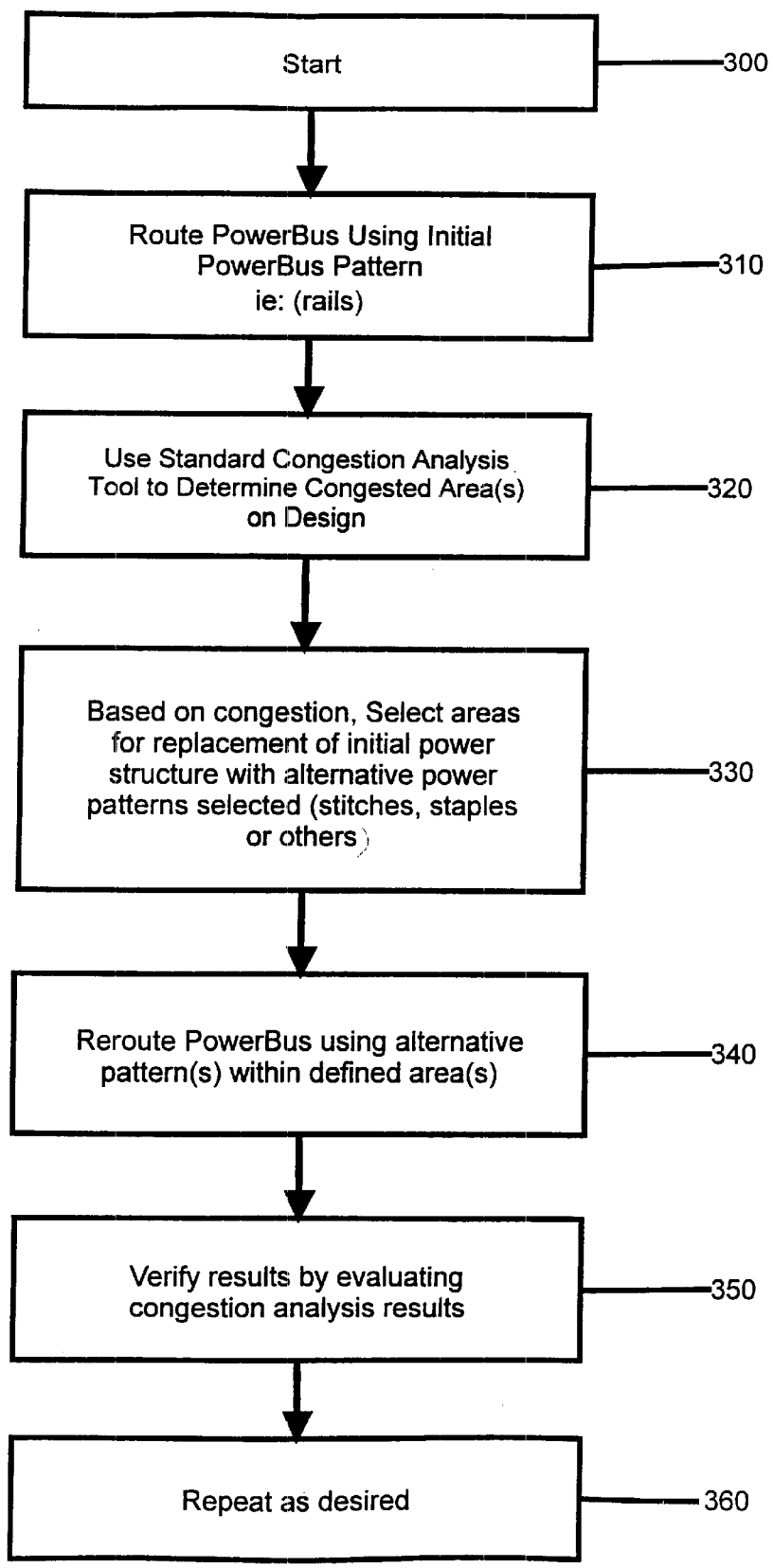
FIG. 9 is another flow diagram illustrating a second embodiment of the invention.

This second embodiment of the invention shown in FIG. 9 provides an alternative for modifying the power rails so as to relieve wiring congestion in affected areas of an ASIC design. This is done by determining area on any metal level that benefits by changing a power pattern from the initial pattern to an alternative pattern after finding congested areas using a congestion analysis tool or after detail signal routing. If after detail signal routing uncompleted connections exist, changing to an alternative pattern may improve the routing of the uncompleted connections. A tool that is used within ChipBench to determine wiring congestion is a hierarchical design planner (HDP) global router tool. This tool takes a placed ASIC design and a given set of metal layers, and it partitions each metal layer into a grid whose edges are arbitrarily, but equally, spaced. Then, the HDP global router tool connects pins with estimated wires as determined by the design while trying to minimize the number of wires crossing any edge in the grid. A metric is given for each edge as a percentage of wires that cross the edge plus an existing-fixed blockage (e.g., power shapes, pins, abstracted blockage, etc.) divided by the total capacity of the edge (i.e., total wiring tracks). In this example, an edge is considered congested if this value is more than 80%. Wireability criteria are associated with this metric. Statistically, congested edges cluster in congested areas. Changing the power pattern to an alternative pattern in a congested area reduces the fixed blockage in the edges in that area, thereby reducing the congestion.

Figure 7:
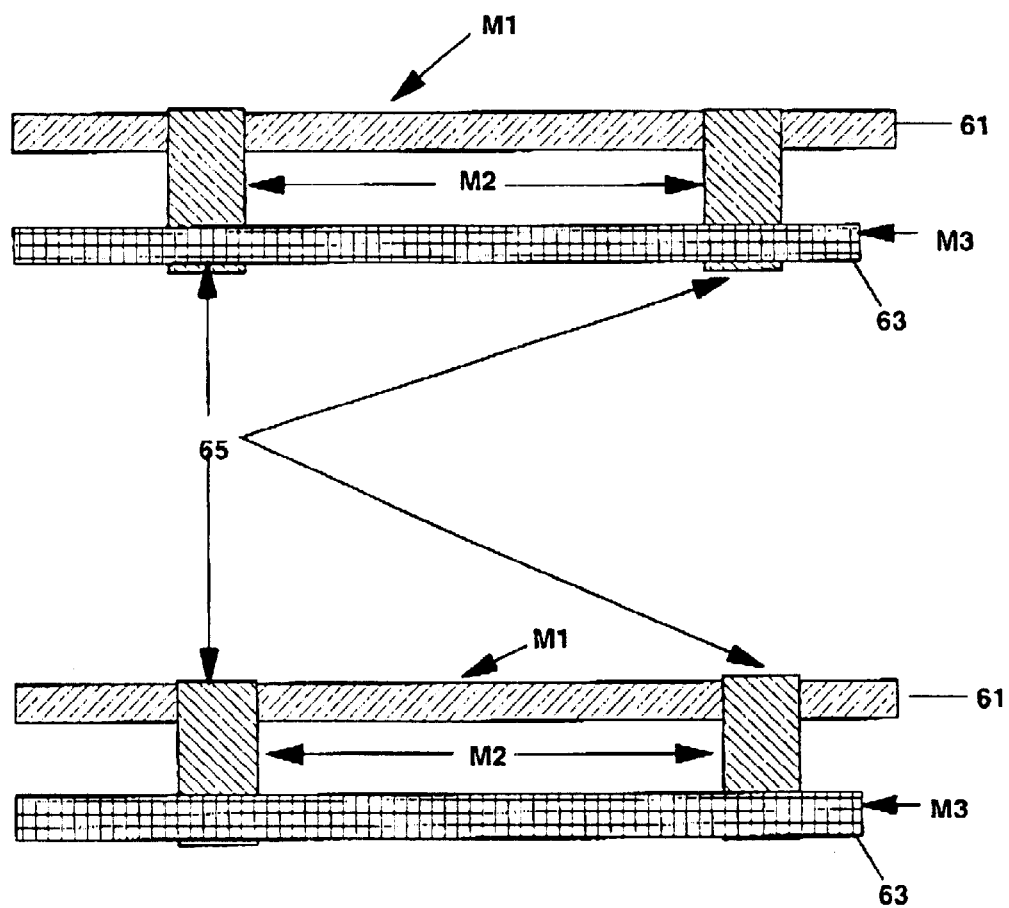
FIG. 7 shows a diagram of an M2 power stitch and how it is connected to M1 and M3 power rails of one polarity of power.
Figure 8:
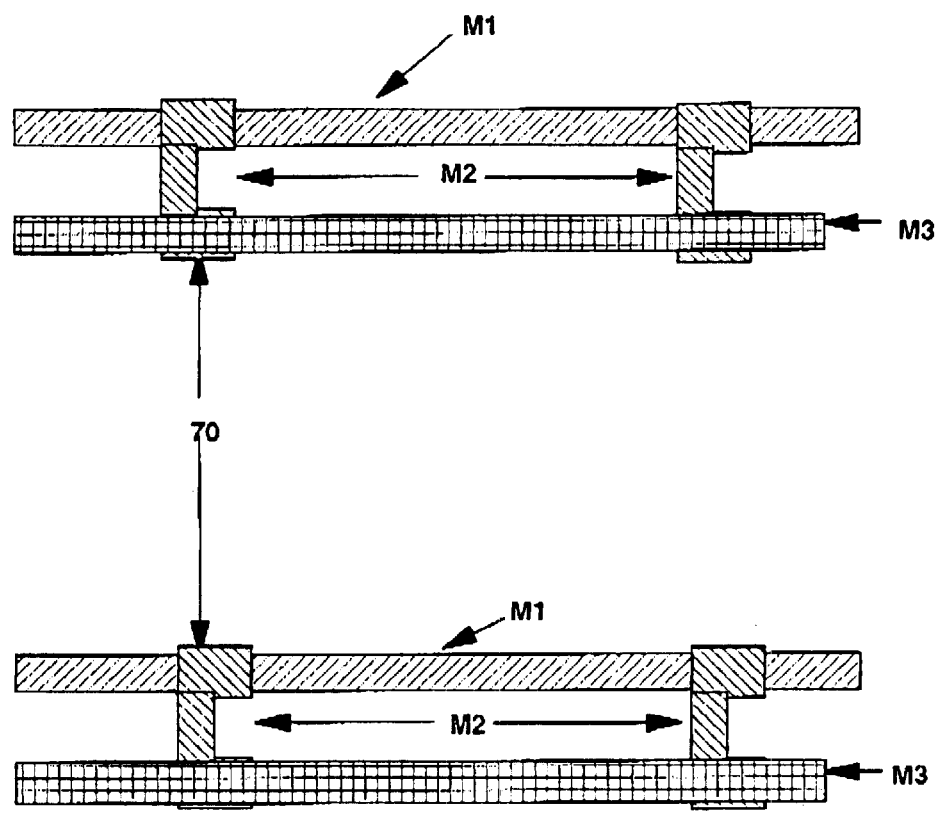
FIG. 8 shows a diagram of an M2 power staple and how it is connected to M1 and M3 power rails of one polarity of power.
Figure 10:
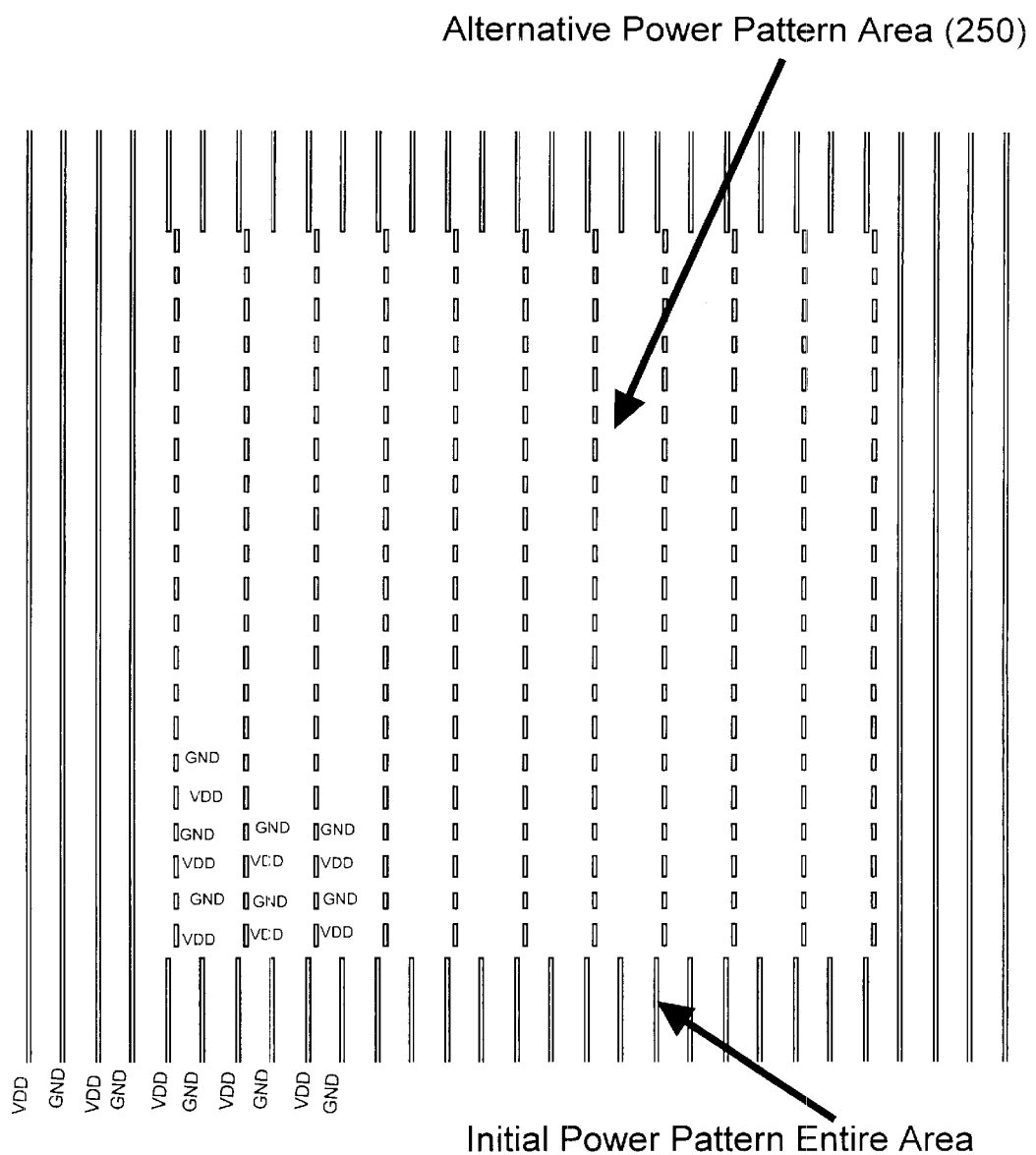
FIG. 10 illustrates the use of the embodiment shown in FIG. 9 for metal level M2 for two polarities of power, VDD and GND.
Figure 12:
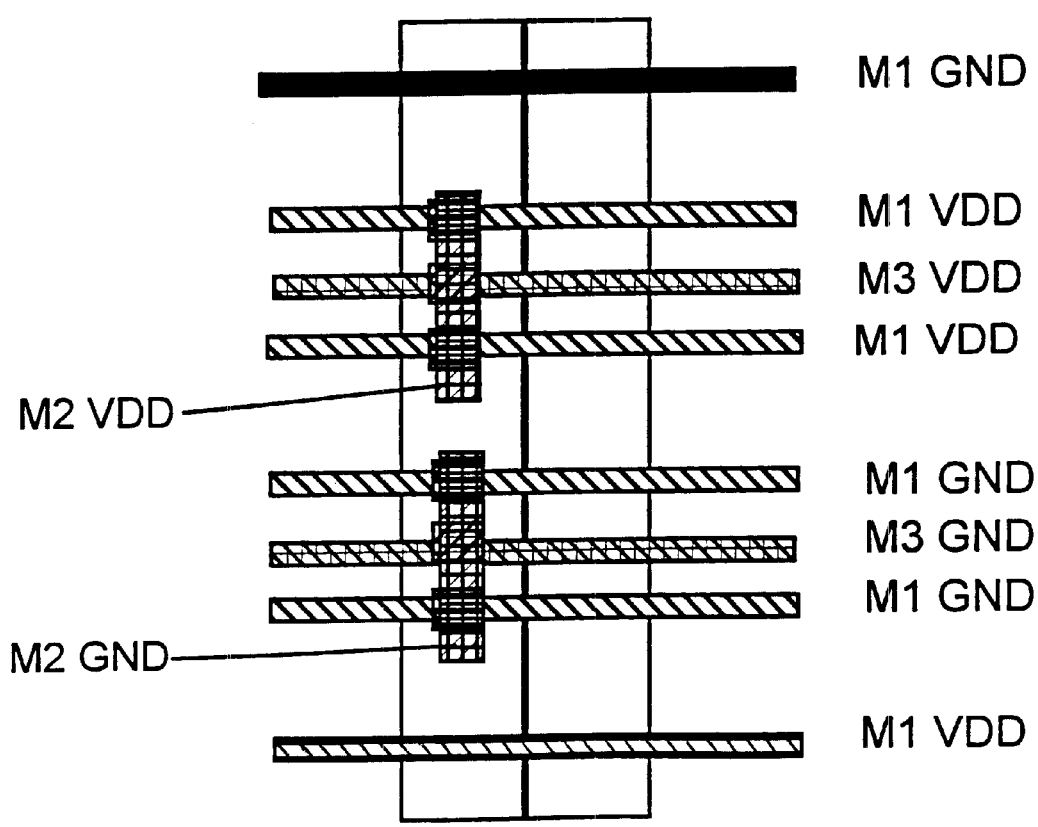
FIG. 12 illustrates the use of M2 metal level stitches and their connection by power vias to M1 and M3 power rails for two polarities of power, VDD and GND, as described by the embodiment shown in FIG. 9.

For example, an initial power pattern of rails that may cause congestion within an area on the design can be changed to an alternative pattern as shown in FIG. 10, wherein stitches 250 provide relief in congested areas. In FIG. 10, which diagrams only the power shapes on M2 for two polarities of power, VDD and GND, the standard M2 power rails are replaced with M2 power stitches 250 as shown. This process can be repeated for each congested area identified on the ASIC design. FIG. 10 shows an M2 alternative pattern of stitches in the middle and initial M2 pattern of rails around the border (see arrows). FIG. 7 shows the interconnection for one polarity of power of the M2 stitches (65) to the M1 (61) and M3 (63) power rails of the design. Power vias are implied at the intersections of the M2 stitch and the M1 and M3 power rails in FIG. 7. FIG. 12 illustrates the stitched environment for two polarities of power, VDD and GND. FIG. 8 shows another alternative pattern for one polarity of power using M2 staples (70) and the interconnection of the staples to the M1 and M3 power rails. Power vias are implied at the intersections of the M2 staples and the M1 and M3 power rails in FIG. 8.

The advantages of this method include fewer data storage requirements for the power shapes and thus less memory requirements and faster performance of the physical design tools compared to using the alternative pattern across the whole ASIC design.

Referring to FIG. 9, the process starts (step 300) by use of an initial power rail design. This involves routing of power rails M1, M2, M3, etc. using initial power patterns generated by the power routing tool (step 310) for each level of the ASIC. Using ChipBench, this step is achieved by running the power router for all metal layers over the entire ASIC design. The results of this are the standard power rails for two polarities of power which are illustrated for M2 as the "initial power pattern entire area" in FIG. 10.

Next at step 320, a standard congestion analysis tool is used to locate congested areas of the design. Based on the congestion analysis, areas of the design are selected for replacement of the initial power rail structure in step 330. Area selection can be performed either automatically or manually. In ChipBench, the results of the HDP global router tool can be displayed graphically which provides the user a visual guide to select areas for an alternative pattern. Areas are specified by either dragging a box with a mouse or by entering the X- and Y-coordinates. Alternatively, automatic tools can select congested areas based on a congestion percentage threshold. Like congestion analysis, the results of detail signal routing can be used to select an area for an alternative pattern either automatically or manually.

Next, at step 340, the power rails are rerouted by a standard power router tool such as the ChipBench power router, using alternative pattern(s) such as staples, stitches or other pattern defined by the technology within the selected areas(s) of the ASIC. FIG. 10 shows the result of this step for M2 power rails replaced by M2 power stitches. As designated by the arrows, the center area contains the alternative pattern while the border contains the initial power rails. In this implementation, the VDD and GND stitches are aligned vertically and in an alternating pattern thereby reducing the fixed blockage by one half. FIG. 7 shows one method for connecting the vertical M2 stitches (65) to the horizontal M1 (61) and M3 (63) power rails as defined by the alternative pattern specified by the technology. M2 stitches begin and end on M1 and M3 horizontal rails in this example and are connected to those rails by power vias (not shown). FIG. 7 has been simplified to illustrate only one polarity of power. FIG. 12 illustrates a stitched environment for two polarities of power, an alternating VDD and GND, verses the non-stitched environment in FIG. 11.

Next, verification (step 350) of this modified design is made by using the congestion analysis again. This step is required to determine if the changes made to the power grid relieve enough congestion to consider the ASIC design wireable. In addition, power analysis could be performed to confirm the robustness of the modified power grid if the technology so required. In the preferred embodiment, alternative patterns available to the tool have been preanalyzed to ensure robustness of the power grid, and power analysis at this design stage is unnecessary.

If the ASIC design still does not meet the congestion threshold requirement (80%) as determined by congestion analysis tool, such as the HDP global router, then this process can be iterated by repeating step 330 and forward.

If using the alternative pattern across the entire ASIC design does not satisfy the 80% congestion metric, then other techniques must be employed such as changing the placement or increasing the number of metal levels in the design.

Figure 13:
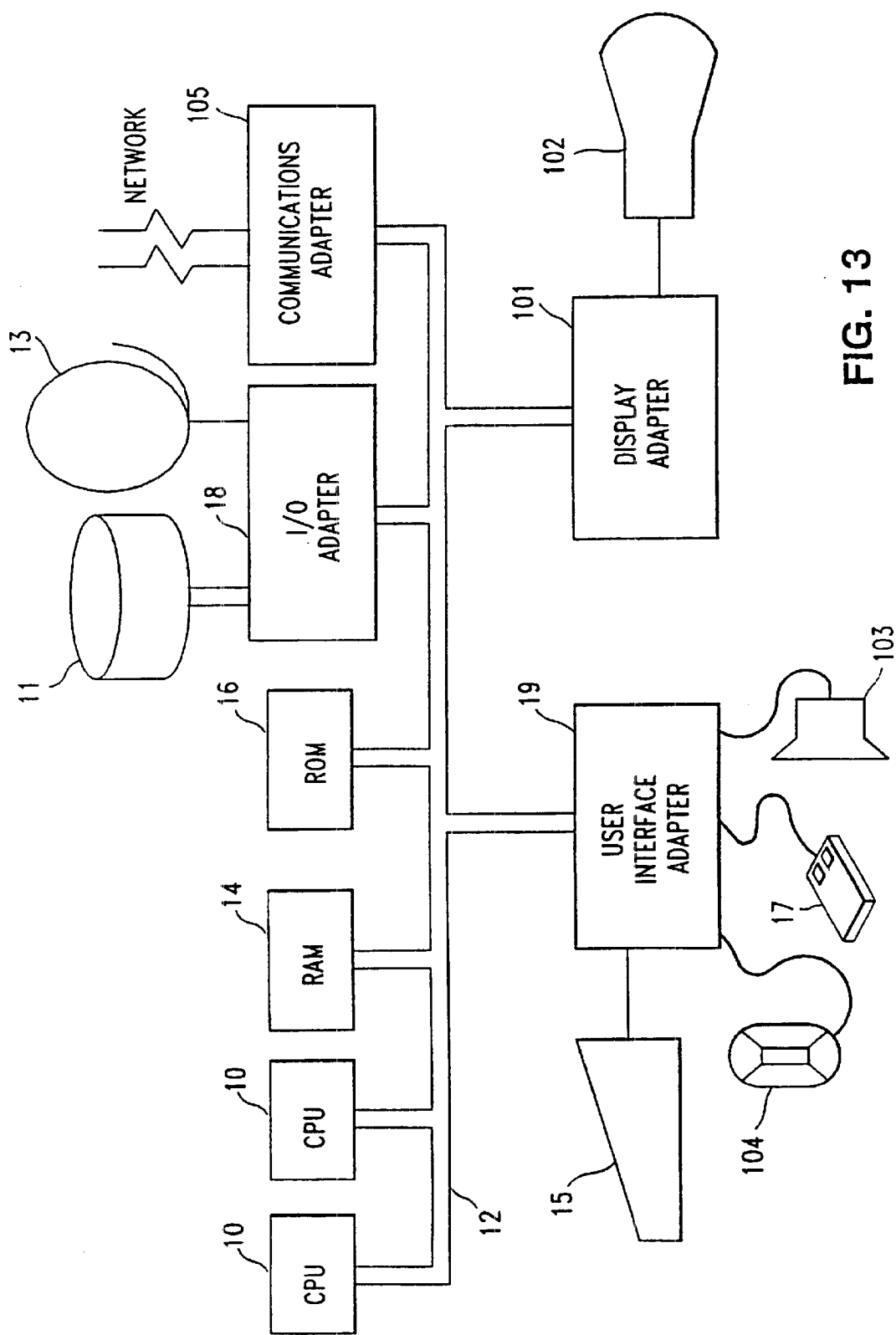
FIG. 13 shows a typical computer system environment for running a computer-based power rail modification tool.

A representative hardware environment for practicing the present invention is depicted in FIG. 13, which illustrates a typical hardware configuration of an information handling/computer system in accordance with the subject invention, having at least one processor or central processing unit (CPU) 10. CPUs 10 are interconnected via system bus 12 to random access memory (RAM) 14, read-only memory (ROM) 16, an input/output (I/O) adapter 18 for connecting peripheral devices, such as disk units 11 and tape drives 13, to bus 12, user interface adapter 19 for connecting keyboard 15, mouse 17, speaker 103, microphone 104, and/or other user interface devices such as a touch screen device (not shown) to bus 12, communication adapter 105 for connecting the information handling system to a data processing network, and display adapter 101 for connecting bus 12 to display device 102. A program storage device readable by the disk or tape units, is used to load the instructions which operate on a wiring interconnect design which is loaded also loaded onto the computer system.

The advantage of either embodiment of the invention is reduced congestion and improved pin accessibility while maintaining the integrity of the power grid which results in improved wireability of the ASIC design such that smaller and more efficient chip design results without impacting the storage requirements and performance of the physical design tools used to produce the chip. Similar reduced congestion and improved wireability could be obtained by initially routing alternative power structures such as staples or stitches throughout the entire ASIC, however, this method results in dramatic increases in the number of power shapes thereby impacting the storage and/or performance of physical design tools. For example, an ASIC with an 8.4 mm image would require more than 1.5 million M2 power stitches for the entire design compared to 2,572 M2 power rails. These 1.5 million power shapes could have a dramatic impact on the storage and performance of CAD tools such as the ChipEdit or the ChipBench as discussed above.

Although the present invention has particular applications to certain specific embodiments, such as power rail modification, this does not limit the present invention. Other modifications may be made by one skilled in the art without departing from the overall spirit and scope of the present invention. Thus, the present invention is to be construed as limited only by the appended claims which follow.

What is claimed is:

1. A method of modifying power rails of an integrated circuit for improved wireability, said method comprising:
   generating a power railing design of said integrated circuit into a three-dimensional rail based model;
   analyzing said power railing design as to placement of said power rails in relation to neighboring elements that effect wireability; and
   modifying a segment of each power rail that affects wireability so that required power supply to said neighboring elements remains unaffected.

2. The method of claim 1, wherein said analyzing comprises examining an initial metal level for said neighboring elements, said elements comprises a pin emanating from said initial metal level, and said pin underlying an examined power rail at a next higher metal level, and wherein said analyzing of said power railing design includes:
   determining whether said examined power rail entirely covers said pin; and determining whether all subsections of said pin are inaccessible, wherein said modifying of said segment of said examined power rail occurs when said pin is inaccessible, and wherein said modification comprises selecting a design consisting of a stitch, staple, or a notched out section of said examined power rail.

3. The method of claim 2, further comprising repeating said analyzing for another pin on said metal level of said design.

4. The method of claim 3, further comprising repeating said analyzing for a subsequent higher metal level of said design.

5. The method of claim 1, wherein said analyzing comprises implementing a congestion analysis tool to determine congested area of said design.

6. The method of claim 5, wherein said modifying of said segment comprises replacing with a member selected from a group consisting of a staple and a stitch.

7. The method of claim 5, further comprising repeating said method until a specified "wireability" criteria is satisfied.

8. The method of claim 5, further comprising repeating said method for another metal level of said integrated circuit.

9. The method of claim 1, wherein said generating of said power rail design comprises implementing a place and route tool.

10. The method of claim 1, wherein said method is used in an application specific integrated circuit design having at least three metal levels.

11. A computerized design system that includes a processor and memory for modifying power rails of an integrated circuit design for improved wireability, said system comprises:

a place and route tool for:
generating a power railing design of said integrated circuit into a three-dimensional rail based model;
analyzing said power railing design as to placement of said power rails in relation to neighboring elements that effect wireability; and
modifying a segment of each power rail that affects wireability so that required power supply to said neighboring elements remains unaffected.

12. The system of claim 11, wherein as part of said place and route tool, said analyzing comprises examining an initial metal level for said neighboring elements, wherein said elements comprises a pin emanating from said initial metal level, and said pin underlying an examined power rail at a next higher metal level, and wherein said analyzing of said power railing design includes:

determining whether said examined power rail entirely covers said pin; and determining whether all subsections of said pin are inaccessible, wherein said modifying of said segment of said examined power rail occurs when said pin is inaccessible, and wherein said modification comprises selecting a design consisting of a stitch, staple, or a notched out section of said examined power rail.

13. The system of claim 12, wherein as part of said place and route tool, said analyzing is repeated for another pin on said metal level of said design.

14. The system of claim 13, wherein as part of said place and route tool, said analyzing is repeated for a subsequent higher metal level of said design.

15. The system of claim 11, wherein as part of said place and route tool, said analyzing comprises implementing a congestion analysis tool to determine congested area of said design.

16. The system of claim 15, wherein as part of said place and route tool, said modifying of said segment comprises replacement with a member selected from a group consisting of a staple and stitch.

17. The system of claim 15, wherein said place and route tool comprises a ChipBench tool suite and wherein said congestion analysis tool comprises a hierarchical design planner (HDP) global router tool.

18. A program storage device readable by machine, tangibly embodying a program of instructions executable by the machine to perform a method of modifying power rails of an integrated circuit design to improve wireability, said method comprising:

generating a power railing design of said integrated circuit into a three-dimensional rail based model;

analyzing said power railing design as to placement of said power rails in relation to neighboring elements that effect wireability; and modifying a segment of each power rail that affects wireability so that required power supply to said neighboring elements remains unaffected.

19. The program storage device of claim 18, wherein said method comprises examining an initial metal level for said neighboring elements, said elements comprises a pin emanating from said initial metal level, said pin underlying an examined power rail at a next higher metal level, and wherein said analyzing of said power railing design includes:

determining whether said examined power rail entirely covers said pin; and determining whether all subsections of said pin are inaccessible, wherein said modifying of said segment of said examined power rail occurs when said pin is inaccessible, and wherein said modification comprises selecting a design consisting of a stitch, staple, or a notched out section of said examined power rail.

20. The program storage device of claim 18, further comprising repeating said analyzing for another pin on said metal level of said design.

21. The program storage device of claim 20, further comprising repeating said analyzing for a subsequent higher metal level of said design.

22. The program storage device of claim 18, wherein said analyzing of said power railing design comprises implementing a congestion analysis tool to determine congested area of said design.

23. The program storage device of claim 22, wherein said modifying of said segment comprises replacing with a member selected from a group consisting of a staple and a stitch.

24. The program storage device of claim 22, further comprising repeating said analyzing until a specified "wireability" criteria is satisfied.

25. The program storage device of claim 22, further comprising repeating said analyzing for each metal level of said integrated circuit.

26. The program storage device of claim 22, wherein said method is used with a place and route tool that comprises a ChipBench tool suite and wherein said congestion analysis tool comprises a hierarchical design planner (HDP) global router tool.

27. The program storage device of claim 18, wherein said method is used with a place and route tool.

* * * * *